United States Patent [19]

Kusaka

[11] Patent Number: 5,367,765
[45] Date of Patent: Nov. 29, 1994

[54] METHOD OF FABRICATING INTEGRATED CIRCUIT CHIP PACKAGE

[75] Inventor: Teruo Kusaka, Tokyo, Japan

[73] Assignee: NEC Corporation, Tokyo, Japan

[21] Appl. No.: 995,525

[22] Filed: Dec. 23, 1992

Related U.S. Application Data

[63] Continuation of Ser. No. 753,580, Sep. 3, 1991, abandoned.

[30] Foreign Application Priority Data

Aug. 31, 1990 [JP] Japan ................... 2-230418

[51] Int. Cl.$^5$ ............................. H05K 3/34
[52] U.S. Cl. ......................... 29/840; 29/593
[58] Field of Search ............... 29/840, 593; 228/175, 228/180.2; 174/263; 361/760

[56] References Cited

U.S. PATENT DOCUMENTS

| 4,818,728 | 4/1989 | Rai et al. ............. | 228/180.2 |
| 5,075,965 | 12/1991 | Carey et al. ........... | 29/840 |

FOREIGN PATENT DOCUMENTS

| 63-80542 | 4/1988 | Japan . |
| 63-141356 | 6/1988 | Japan . |
| 2-14536 | 1/1990 | Japan . |
| 2174153 | 7/1990 | Japan . |

OTHER PUBLICATIONS

1990 Symposium on VLSI Technology, Digest on Technical Papers, 4–7 Jun. 1990, pp. 95–96, Hayashi et al., "Fabrication of three-dimensional IC using Cumulatively Bonded IC (CUBIC) technology".
Patent Abstracts of Japan, vol. 14, No. 441, 20 Sep. 1990 (2-174153).
Patent Abstracts of Japan, vol. 12, No. 402, 25 Oct. 1988 (63-141356).
Patent Abstracts of Japan, vol. 14, No. 156, 26 Mar. 1990 (2-14536).

Primary Examiner—P. W. Echols
Attorney, Agent, or Firm—Sughrue, Mion, Zinn, Macpeak & Seas

[57] ABSTRACT

A method of fabricating an integrated circuit chip package is provided in which a multi-chip module is formed by mounting a plurality of IC chips on a single silicon circuit board by means of flip-chip interconnection. Compared with a conventional multi-chip module in which, in order to obtain a uniform gap between IC chips and a silicon circuit board, metal bumps provided on both the silicon circuit board and the IC chips are used, such gap is defined in the present method by thicknesses of organic insulating films formed on both the IC chips and the circuit board. That is, height of metal bumps is selected such that it is smaller than a sum of the thicknesses of the insulating films and that closed spaces due to melting of solder for metal bump connection is prevented from being formed between the organic insulating films.

9 Claims, 2 Drawing Sheets

METHOD OF FABRICATING INTEGRATED CIRCUIT CHIP PACKAGE

This is a continuation of application Ser. No. 07/753,580 filed Sep. 3, 1991 now abandoned.

BACKGROUND OF THE INVENTION

The present invention relates to a method of fabricating an integrated circuit (IC) chip package and, particularly, to a method of fabricating a multi-chip module using flip-chip bonding technique (interconnection).

As a means for increasing electronic circuit density, a printed-circuit board (PCB) has been used heretofore. A number of IC devices (including LSIs, VLSIs), together with other circuit elements and interconnections between such IC devices and circuit elements, are mounted on a PCB and connections to external circuits are realized by printed wirings on the PCB and/or connectors provided thereon. Each of such IC devices is provided as a single chip package which contains a single IC chip which is usually sealed. Therefore, in order to increase the electronic circuit density on a PCB, it is necessary to increase the wiring density on the PCB so that a larger number of single chip IC devices can be mounted on the PCB. However, since respective IC devices have certain size and the wirings have certain width, it is impossible to increase the circuit density of the PCB beyond a certain limit. Therefore, it is difficult to make a PCB-based device sufficiently compact. Further, in the PCB-based device, it is difficult to dissipate heat generated in respective IC devices. Further, since it is difficult to shorten signal paths within the device, the upper limit of the signal bit rate capable of being processed in that device is low.

As a means for solving these problems, a multi-chip IC package has been proposed, which comprises a ceramic substrate having a multi-layered wiring and a plurality of IC chips mounted thereon and connected to the wiring. In such ceramic substrate-based multi-chip package, the requirements of compactness, improved reliability and shortened signal path can be achieved. However, the problem of heat dissipation can not be fully solved due to the low thermal conductivity of the ceramic substrate. In addition to this, a problem of destruction of IC chips occurs due to differences in thermal expansion between the IC chips and the ceramic substrate.

In view of these difficulties with the ceramic substrate, the use of a silicon substrate rather than the ceramic substrate has been proposed. A silicon wiring substrate has a heat conductivity high enough to solve the problem of heat dissipation and hence the problem of thermal expansion difference. In addition, the use of a silicon substrate is advantageous since the state-of-art techniques for fabricating IC chips which includes lithography technique, inter-layer wiring technique, etc., can be directly used for processing of the silicon circuit substrate. Further, since respective IC chips to be mounted on the silicon circuit substrate in accordance with the multi-chip scheme may be tested after their diffusion processes, the reliability of an assembled multi-chip module becomes high. Further, IC chips to be mounted on the circuit board can be flexibly combined. For example, a combination of MOS IC chips and bipolar IC chips, a combination of MOS IC chips and compound semiconductor IC chips, etc., may be possible. (The above-mentioned prior arts are disclosed in John K. Hagge, "Ultra-Reliable Packaging for Silicon-on-Silicon WSI", IEEE Transactions on Components, Hybrids, and Manufacturing Technology, Vol. 12, No. 2 (Jun. 1989), P. 170 to 179.)

In order to effectively dissipate heat, it is usual to attach a member such as a heat sink intimately onto a surface of a silicon circuit board which is opposite to that on which IC chips are mounted, by means of suitable adhesive. With this construction, heat produced in a plurality of IC chips is transmitted through the silicon circuit board to the heat sink, resulting in insufficient heat dissipation. Particularly, in a multi-chip module having a structure in which a gap is left as it is between the IC chips and the silicon circuit board, the heat dissipation effect is usually insufficient.

A module construction in which a plurality of IC chips are mounted on a silicon circuit board through flip-chip interconnection in face-down configuration and in which the heat sink member is intimately attached to a rear surface of the chip may be optimum for heat dissipation. However, in order to assure the heat dissipation effect, it is necessary that the rear surfaces of the IC chips mounted on the silicon circuit board in a face-down manner are coplanar and the intimate contact of the respective rear surfaces of the IC chips with the heat sink is maintained. That is, it is necessary that the respective IC chips are uniformly fixed on the silicon circuit board. However, when the chips are not uniformly positioned on the substrate but, for example, are tilted relative to the plane of the substrate, a gap may be left between the heat sink men%her and the IC chips, resulting in a degraded thermal conduction therebetween and hence degraded heat dissipation.

The arrangement of the plurality of IC chips fixed on the silicon circuit board with a uniform gap therebetween in thickness direction of the chips is usually realized by using metal bumps provided on either or both of the IC chips and the circuit board for interconnection of the flip-chip. According to the method disclosed in, for example, Japanese Kokai (P) 63-141356 published on Jun. 13, 1988, metal bumps each of Cu or Au whose height is larger than a thickness of a surface insulating film of $SiO_2$ or SiN formed on an IC chip are formed. On the other hand, the insulating film is formed with holes at positions corresponding to these ]Dumps and solder of Sn, Pb and In, etc., is disposed in each of the holes. The solder is melted when the holes and the bumps are mated with each other, so that the IC chips are fixed to the silicon circuit board. The metal bumps substantially define the gap between the IC chips and the silicon circuit board and the solder contributes to finely regulate the gap.

A technique in which electric connection between IC chips and a silicon circuit board is performed by using not solder but the shrinking effect of photo-polymerizing resin with light illumination has been proposed (cf. R. Harada et al., "Applications of New Assembly Method "Micro Bump Bonding Method"", International Electronic Manufacturing Technology symposium, from P. 47). In this technique, a gap between the IC chip and the silicon circuit board is mainly determined by a sum of heights of metal bumps of Au provided on both the IC chip and the silicon circuit board and the photo-polymerizing resin is used such that the metal bumps are reliably connected electrically when the bumps are mated with each other. As is clear from this construction, it is impossible to finely regulate the gap between the chip and the circuit board after the adhesive resin is photo-polymerized.

The technique disclosed in the above-mentioned Japanese Kokai is advantageous over other prior art techniques in that the gap between the IC chip and the silicon circuit board can be regulated finely by means of the solder disposed in the holes of the surface insulating film. However, there remains the disadvantage that, when the metal bumps of the IC chips are fitted in the holes of the insulating film on the silicon circuit board, a hollow cylindrical gap whose boundary is defined by the molten solder, the side wall of the hole and the bottom portion of the metal bump, is formed in each hole. Air enclosed in these cylindrical gaps may expand by temperature increase after assembling of a multi-chip module, deforming the members defining the space or, in the worst case, destroying a portion of these members. In the conventional technique using solder, the connection and fixing of the IC chips are performed in a single step and, after being fixed, it is difficult to selectively replace a defective IC chip or chips with new one or ones when such defect is detected.

BRIEF SUMMARY OF THE INVENTION

Therefore, an object of the present invention is to provide a method of fabricating a multi-chip module having a plurality of IC chips mounted on a silicon circuit board through flip-chip interconnection, by which the gap between the IC chips and the circuit board in its thickness direction can be regulated without forming such air space.

Another object of the present invention is to provide a method of fabricating a multi-chip module having a plurality of IC chips mounted on a silicon circuit board through flip-chip interconnection, in which the electric characteristics of the module are checked in a state where the IC chips are temporarily fixed to detect defective chips and, after defective chips are replaced by new ones, all of the IC chips can be fixed to the circuit board permanently.

According to the present invention, a method of fabricating an integrated circuit chip package forming a multi-chip module which includes a plurality of IC chips, each having on one surface thereof a plurality of metal bumps connected to a single, flat silicon circuit board having in at least a portion of its surface a predetermined wiring pattern, through the metal bumps by means of flip-chip interconnection, the method including the steps of forming a first flat film of an organic insulating material on the one surfaces of the IC chips up to a first thickness; forming a plurality of first through-holes in the first flat film at predetermined positions and forming the metal bumps within the first through-holes; forming a second flat film of an organic insulating material on a surface of the silicon circuit substrate up to a second thickness; forming in the second flat film a plurality of second through-holes located at positions corresponding respectively to the metal bumps of the IC chips; filling the second through-holes with solder metal, respectively; coating at least one of the first flat film and the second flat film with adhesive of thermosetting organic insulating material; and heating with the metal bumps being mated with the second through-holes to melt the solder metal and to thermoset the adhesive.

In the present invention, the organic insulating material forming the first film and the second film may be of thermoset polyimide and the adhesive in the coating step may be of polyimide before thermosetting.

Further, in the present invention, the thickness of the first film may be smaller than the second film.

The step of filling the through-holes with the solder metal may comprise a first step of filling the through-holes with relatively high melting point metal and a second step of filling the through-holes with relatively low melting point metal.

Further, the sum of the thicknesses of the first film and the second film may be larger than the height of the metal bumps.

The present method may further comprise the step of disposing on surfaces of the IC chips opposite to the one surfaces thereof heat sink members with surfaces of the heat sink members being in intimate contact with the opposite surfaces of the IC chips.

In the present invention, the step of melting solder metal includes a pre-heating step of melting the low melting point metal and a main heating step of melting the high melting point metal so that, after the pre-heating step is completed, the electrical connections of the multi-chip module can be checked.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

An embodiment to be described subsequently is directed to a multi-chip module equipped with three microprocessors each designed for an engineering work station (EWS) for high rate data processing. It should be noted, however, that the fabricating method according to the present invention can be applied to other multi-chip modules for general use.

Figure 1:
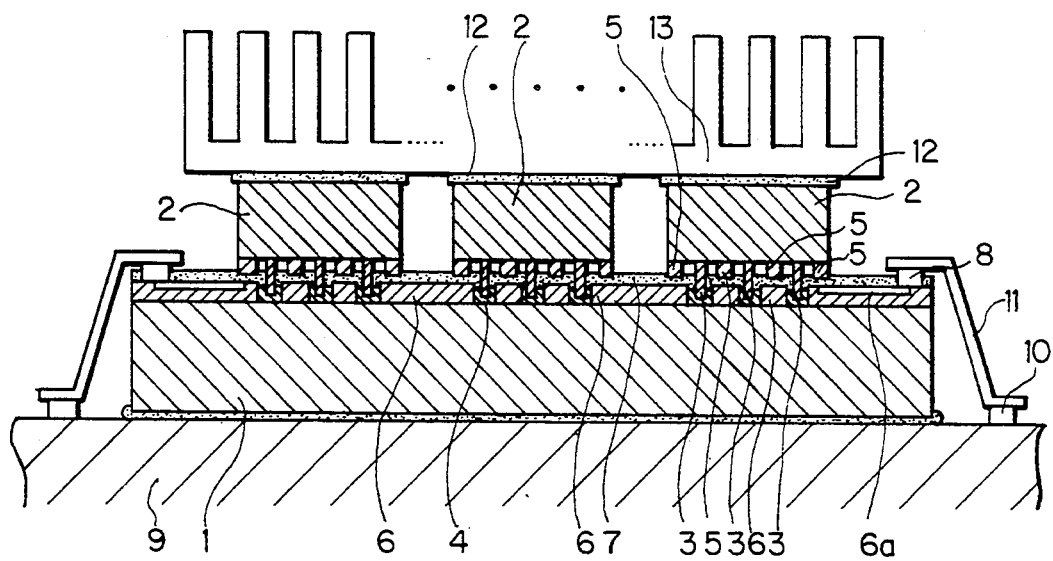
FIG. 1 is a longitudinal cross section of an IC multi-chip package for explaining an embodiment of the present invention.

Referring to FIG. 1 showing a longitudinal cross section of an IC multi-chip module fabricated according to the present invention, the module comprises a silicon circuit board 1, three IC chips 2 mounted on a surface of the circuit board 1 according to a face-down scheme and a heat dissipation fin 13 mounted on rear surfaces of the IC chips 2 through thermal grease 12. Connecting pads 8 are formed on a peripheral portion of the circuit board 1 for electrical connection through lead wires 11 for TAB (Tape Automated Bonding) to connecting pads 10 on a PCB 9 on which the module is to be mounted.

Figure 2A:
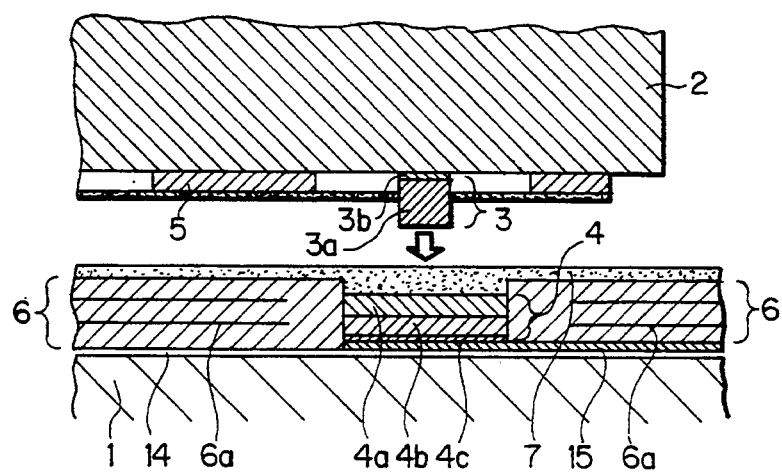
FIGS. 2A to 2C show portions of FIG. 1 in expanded scale to explain certain steps of the method according to the present invention, respectively.
Figure 2B:
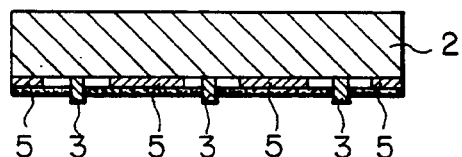
Figure 2C:
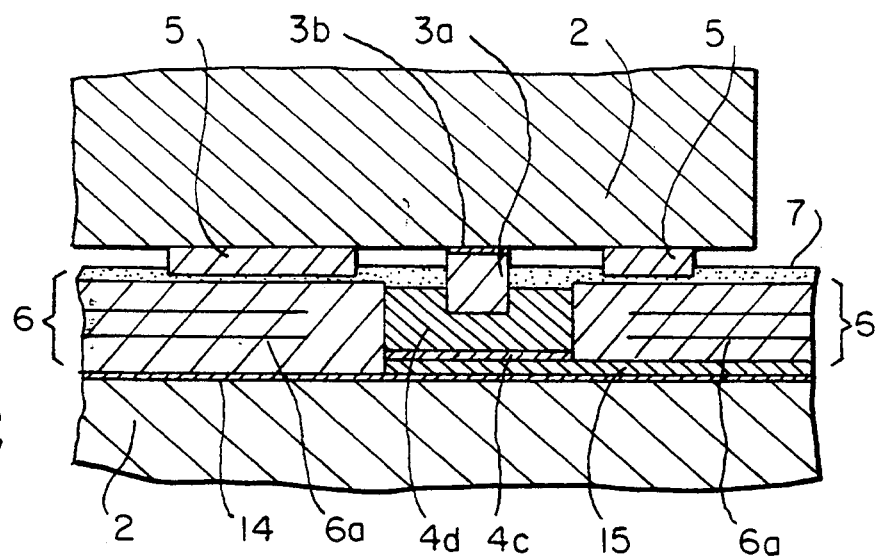
Figure 3A:
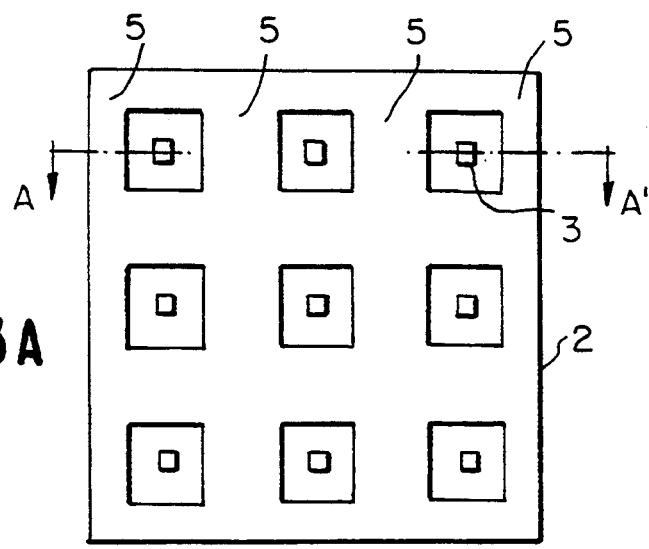
FIGS. 3A and 3B are plan views of an IC chip to be mounted on a silicon circuit board of a multi-chip module and a cross section taken along a line A—A in FIG. 3A, respectively.
Figure 3B:
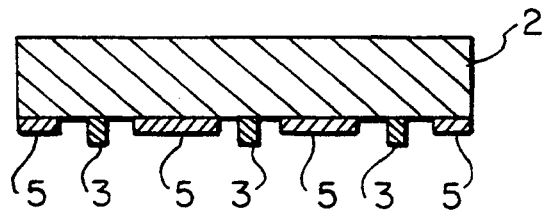

Referring to FIGS. 2A to 2C showing one of the three IC chips 2, the IC chip 2 is a complete microprocessor chip obtained through predetermined steps including such as diffusion. On a front surface of the IC chip 2, an organic insulating film 5 having a first thickness is formed and patterned by selective etching with a photoresist film to form through-holes at desired positions. In each of these through-holes, a metal layer 3b of titanium (Ti) or chromium (Cr), etc., is formed to a thickness of 0.1 to 0.3 μm by vapor deposition and further a metal layer 3a of gold (Au) or copper (Cu), etc., is formed thereon. In this step, the film 5 is formed by spin-coating the IC chip surface with liquid polyimide and thermosetting it by heating it to a temperature of 400° C. to 450° C. The thickness of the film 5, that is, the first thickness is selected as 5 μm. The structure of the IC chip 2 is shown in plan view in FIG. 3A and in cross section taken along a line A—A in FIG. 3A in FIG. 3B. That is, air release paths are provided in the film 5.

Returning to FIG. 2, on a surface of the silicon circuit board 1, an inorganic insulating film 14 of silicon dioxide ($SiO_2$) or a mixture of silicon dioxide and silicon nitride (SIN) is formed to a thickness of 0.5 μm to 2.0 μm through oxidation step or vapor deposition step and, on the film 14, a suitably patterned substrate wiring layer 15 of copper (Cu), gold (Au) or aluminum (Al) is formed. Further, an organic insulating film 6 having a second thickness and including a multi-layered wiring 6a composed of three to five wiring layers (only two layers are shown in FIG. 2 for simplicity of illustration) is formed on the wiring layer 15 and the film 14. The organic insulating film 6 is formed by laminating wiring layers of copper (Cu), gold (Au) or aluminum (Al) with using polyimide layers each having thickness of 15 to 29 μm and formed by spin coating as in the case of the film 5 on the chip 2 as interlayer insulating films and heating the alternating lamination of the wiring layers and the polyimide layers to thermoset polyimide.

A square through-hole having each side of 30 to 100 μm is formed in the insulating film 6 at a predetermined position, that is, a position corresponding to the metal bump 3 of the IC chip by using a similar step to that used in forming the through-hole of the film 5 and filled with solder metal 4. The solder metal 4 includes a thin base layer 4c of nickel (Ni) formed on the substrate wiring layer 15 by direct plating, a high melting point metal layer 4b of relatively high melting point metal such as gold-silicon (Au-Si) alloy or lead-tin alloy (95% Pb/5% Sn) formed on the base layer 4c and a low melting point metal layer 4a of indium (In) or eutectic solder, etc., formed on the layer 4b.

After the above-mentioned processings are performed with respect to the IC chips 2 and the silicon circuit board 1, either or both of the films 5 and 6 are painted (i.e. coated) uniformly with liquid polyimide to form thin polyimide film, then the IC chips 2 are pressed to the silicon circuit board 1 with the metal bumps 3 being mated with the solder metal 4 to form a semi-assembly and, thereafter, the semi-assembly is heated to a temperature slightly above a melting point of the solder metal layer 4a and lower than the melting point of the solder metal layer 4b. In this step, a plurality of test probes (not shown) of a measuring device are connected to the connecting pads 8 to check electrical connections between the IC chips 2 and the circuit board 1. When it is determined, as a result of this check, that the connection between a certain IC chip 2 and the silicon circuit board 1 is not performed, the certain IC chip 2 may be replaced with a new chip. When the check shows that all of the IC chips 2 are in correct connection states, the semi-assembly is further heated to a temperature above the melting point of the solder metal layer 4b while keeping the press contact of the IC chips 2 with the silicon circuit board 1 to thermoset the adhesive resin 7 of the thin polyimide layers and to make the electric connection between the solder metal 4 and the metal bump 3 complete (at this time, the solder metal layers 4a and 4b are melted together to form a single solder metal layer 4d).

In order to avoid formation of a closed space around the metal bump 3 by the side walls of the through-holes of the films 5 and 6 in the above-mentioned pressure contact and heating steps, these through-holes have discontinuous walls (not shown) at least in the vicinity of each of metal bumps 3 in a circular or square peripheral direction around an axis of the metal bump 3. With this construction, the problem occurring when air is left in the closed space, that is, the problem that constitutional components of a multi-chip package are deformed due to temperature variation after it is assembled, can be prevented from occurring.

Instead of the heat dissipation fin 13 of the IC multi-chip package shown in FIG. 1, it is possible to adhere a heat radiator block to IC chips by thermal grease. Such a heat radiation block is made of stainless steel and has cooling channels through which cooling water flows thereby exhibiting a cooling effect superior to the fin 13.

As described hereinbefore, in the present invention, a distance between the IC chips and the silicon circuit board is defined by thicknesses of the organic insulating films formed on the IC chip side and the circuit board side, respectively to obtain a uniformity of the gap therebetween. That is, since the height of the metal bump is selected as being smaller than a sum of the thicknesses of these films and the through-holes of these films have discontinuous walls (not shown) at least in the vicinity of each of them in a circular or square peripheral direction around an axis of the metal bump, the space around the metal bump never be sealed. Further, since the organic insulating film on the side of the circuit board is made thicker to give a large space for melted solder in the through-hole thereof, it is possible to fill the space around the metal bump with a sufficient amount of melted solder when it is dipped therein. Thus, the formation of closed space in the organic insulating film due to melting of solder for connection of the metal bump is avoided. Further, it is possible to form the solder as a double layer structure of a relatively low melting point metal and a high melting point metal and perform electric connection test during the pre-heating step for melting the low melting point metal.

Although the present invention has been described with reference to a specific embodiment, this description is not meant to be construed in a limiting sense. Various modifications of the disclosed embodiments, as well as other embodiments of the present invention. It is therefore contemplated that the appended claims will cover any modifications or embodiments as fall within the true scope of the present invention.

What is claimed is:

1. A method of fabricating an integrated circuit chip package forming a multi-chip module including a plurality of IC chips each having a plurality of metal bumps formed on one surface thereof and connected to a single, flat silicon circuit board having in at least a portion of its surface a predetermined wiring pattern through said metal bumps by means of flip-chip interconnection, said method comprising the steps of:

forming a first flat film of an organic insulating material on said one surfaces of said IC chips up to a first thickness;

forming a plurality of first through-holes in said first flat film at predetermined positions, and forming said metal bumps within said first through-holes;

forming a second flat film of an organic insulating material on a surface of said silicon circuit board up to a second thickness;

forming in said second flat film a plurality of second through-holes, said second through-holes being located at positions corresponding respectively to said metal bumps of said IC chips;

filling said second through-holes with solder metal, respectively;

coating at least one of said first flat film and said second flat film with adhesive of thermosetting organic insulating material;

placing said IC chips on said silicon circuit board such that each of said metal bumps of said IC chips mates with a corresponding solder metal, said adhesive of thermosetting organic insulating material thereby adhering said first flat film on said IC chips and said second flat film on said silicon circuit board to each other and surrounding each of said metal bumps of said IC chips in contact therewith; and performing a heat treatment to connect each of said metal bumps and said solder metal by melting said solder metal and to bond said first and second flat films to each other by thermosetting said adhesive.

2. The method claimed in claim 1, wherein said organic insulating material forming said first film and said second film is thermoset polyimide and said adhesive in said coating step is polyimide before thermosetting.

3. The method claimed in claim 2, wherein said first film is thinner than said second film.

4. The method claimed in claim 1 or 2, wherein said step of filling said second through-holes with said solder metal comprises a first step of filling said second through-holes with relatively high melting point metal and a second step of filling said second through-holes with relatively low melting point metal.

5. The method claimed in claim 1 or 2, wherein a sum of thicknesses of said first film and said second film is larger than a height of said metal bump.

6. The method claimed in claim 1 or 2, further comprising the step of disposing on surfaces of said IC chips opposite to said one surfaces thereof a heat sink member with a surface of said heat sink member being in intimate contact with said opposite surfaces of said IC chips.

7. The method claimed in claim 6, further comprising, before the step of disposing, the step of painting said opposite surfaces with thermal grease.

8. The method claimed in claim 4, wherein the step of performing a heat treatment comprises a pre-heating step of melting said los melting point metal and a main heating step of melting said high melting point metal so that, after the pre-heating step is completed, electrical connection between said silicon circuit board and said IC chips can be checked.

9. A method of fabricating an integrated circuit chip package forming a multi-chip module, said multi-chip module including a plurality of IC chips mounted on a silicon circuit board, said method comprising the steps of:

forming a first flat film of an organic insulating material on a surface of each of said IC chips up to a first thickness;

forming a plurality of first through-holes in said first flat film to expose respective terminals of a corresponding one of said IC chips, each of said first through-holes having a first size;

forming metal bumps on said respective terminals of the corresponding one of said IC chips exposed by said first through-holes;

forming a second flat film of an organic insulating material on a surface of said silicon circuit board up to a second thickness;

forming a plurality of second through-holes in said second flat film, each of said second through-holes being located at a position corresponding to an associated one of said metal bumps of said IC chips and having a second size that is smaller than said first size;

forming solder metal into said second through-holes, respectively;

coating adhesive of thermosetting organic insulating material on said second flat film and said solder metal such that said adhesive of thermosetting organic insulating material has a uniform, flat surface and fills respective ones of said second through-holes;

placing said IC chips on said silicon circuit board such that each of said metal bumps of said IC chips mates with the corresponding solder metal by penetrating said adhesive, said adhesive thereby adhering said first flat film on said IC chips and said second flat film on said silicon circuit board to each other and surrounding each of said metal bumps of said IC chips in contact therewith; and performing a heat treatment to connect each of said metal bumps and said solder metal by melting said solder metal and to bond said first and second flat film to each other by thermosetting said adhesive.

* * * * *

UNITED STATES PATENT AND TRADEMARK OFFICE
CERTIFICATE OF CORRECTION

PATENT NO. : 5,367,765
DATED : Nov, 29, 1994
INVENTOR(S) : Teruo KUSAKA

It is certified that error appears in the above-identified patent and that said Letters Patent is hereby corrected as shown below:

Col. 2, line 31, delete "men%her" and insert --member--.

Col. 8, line 3, delete "los" and insert --low--.

Signed and Sealed this

Eleventh Day of April, 1995

Attest:

BRUCE LEHMAN

Attesting Officer      Commissioner of Patents and Trademarks